United States Patent
Kaneko et al.

(10) Patent No.: US 11,473,188 B2
(45) Date of Patent: Oct. 18, 2022

(54) SPUTTERING APPARATUS

(71) Applicant: ULVAC, INC., Chigasaki (JP)

(72) Inventors: Toshinori Kaneko, Chigasaki (JP); Tetsuhiro Ohno, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 121 days.

(21) Appl. No.: 16/321,666

(22) PCT Filed: Jun. 28, 2018

(86) PCT No.: PCT/JP2018/024572
§ 371 (c)(1),
(2) Date: Jan. 29, 2019

(87) PCT Pub. No.: WO2019/004351
PCT Pub. Date: Jan. 3, 2019

(65) Prior Publication Data
US 2021/0285094 A1    Sep. 16, 2021

(30) Foreign Application Priority Data

Jun. 28, 2017   (JP) .............................. JP2017-126261

(51) Int. Cl.
*C23C 14/50* (2006.01)
*C23C 14/34* (2006.01)
*C23C 14/35* (2006.01)

(52) U.S. Cl.
CPC ........ *C23C 14/505* (2013.01); *C23C 14/3407* (2013.01); *C23C 14/35* (2013.01)

(58) Field of Classification Search
CPC . H01J 37/3441; H01J 37/3447; C23C 14/505; C23C 14/35; C23C 14/3407; C23C 14/50
See application file for complete search history.

(56) References Cited

U.S. PATENT DOCUMENTS

| 2004/0026363 A1* | 2/2004 | Akamatsu | H05K 3/007 216/13 |
| 2005/0056535 A1 | 3/2005 | Nagashima et al. | |

(Continued)

FOREIGN PATENT DOCUMENTS

| CN | 103094492 | 5/2013 |
| CN | 103290377 | 9/2013 |

(Continued)

OTHER PUBLICATIONS

KR-20090058993-A Translation (Year: 2009).*

(Continued)

*Primary Examiner* — Jennifer Wecker
*Assistant Examiner* — Patrick S Ott
(74) *Attorney, Agent, or Firm* — Grossman, Tucker, Perreault & Pfleger, PLLC

(57) ABSTRACT

A sputtering apparatus of the present invention is an apparatus performing deposition on a substrate to be processed using a sputtering method and includes a vacuum chamber, a target provided on a surface of a cathode provided in the vacuum chamber, a substrate holder provided in the vacuum chamber to face the target, and a swing unit that causes the substrate holder to be swingable with respect to the target. A swing region of the substrate to be processed in the substrate holder is set to be smaller than an erosion region of the target.

3 Claims, 9 Drawing Sheets

(56) References Cited

U.S. PATENT DOCUMENTS

| | | | |
|---|---|---|---|
| 2005/0061666 A1* | 3/2005 | Gupta | H01J 37/3455 204/298.2 |
| 2007/0131538 A1 | 6/2007 | Nagashima | |
| 2008/0121620 A1* | 5/2008 | Guo | C23C 14/3464 216/67 |
| 2015/0303041 A1* | 10/2015 | Lindenberg | C23C 16/042 204/298.03 |
| 2016/0186312 A1* | 6/2016 | Wang | H01J 37/3473 428/702 |

FOREIGN PATENT DOCUMENTS

| | | | | |
|---|---|---|---|---|
| CN | 104404466 | | 3/2015 | |
| CN | 105518179 | | 4/2016 | |
| JP | 08-008213 | | 1/1996 | |
| JP | 09-256143 | | 9/1997 | |
| JP | 2009-041115 | | 2/2009 | |
| JP | 2012-158835 | | 8/2012 | |
| JP | 2013-204097 | | 10/2013 | |
| JP | 2015-147953 | | 8/2015 | |
| JP | 5869560 | | 1/2016 | |
| KR | 10-2009-0058993 | | 6/2009 | |
| KR | 20090058993 A * | 6/2009 | |
| KR | 10-2014-0099340 | | 8/2014 | |
| KR | 10-2014-0116067 | | 10/2014 | |
| WO | 2010/044257 | | 4/2010 | |
| WO | WO-2012140798 A1 * | 10/2012 | H01J 37/3435 |
| WO | 2016/167233 | | 10/2016 | |
| WO | WO-2016167233 A1 * | 10/2016 | H01L 21/683 |

OTHER PUBLICATIONS

WO-2016167233-A1 Translation (Year: 2016).*
Notice of Allowance from related Korean Application No. 10-2019-7002524 dated Oct. 22, 2020. English translation attached.
Office Action from related Chinese Application No. 201880002937.9 dated Jul. 1, 2020. English translation attached.
Office Action from related Korean Application No. 10-2019-7002524 dated Jun. 3, 2020. English translation attached.
International Search Report from corresponding PCT Application No. PCT/JP2018/024572 dated Sep. 11, 2018. English translation attached.
Office Action from related Taiwanese Application No. 107122283 dated Jun. 12, 2019. English translation attached.

* cited by examiner

SPUTTERING APPARATUS

TECHNICAL FIELD

The present invention relates to a sputtering apparatus, and particularly to a technology suitably used for deposition with a magnetron cathode.

Priority is claimed on Japanese Patent Application No. 2017-126261, filed in Japan on Jun. 28, 2017, the content of which is incorporated herein by reference.

BACKGROUND ART

As described in Patent Document 1, in a film formation apparatus having a magnetron cathode, a method of moving a magnet with respect to a target for the purpose of improving utilization efficiency of the target or the like is known.

Also, as in the technology disclosed in Patent Document 1, it is also known to swing a cathode and a target with respect to a deposition substrate in addition to movement of a magnet for the purpose of improving deposition uniformity.

In an apparatus which swings a magnet or a cathode as in the technology disclosed in Patent Document 1, dust generated from a friction portion during swinging is always present.

For this reason, although not disclosed in Patent Document 1, for the purpose of preventing generated particles from adversely affecting deposition in a sputtering chamber, it is necessary to provide an internal chamber for housing and sealing a drive unit that swings a magnet and/or a cathode in the sputtering chamber (Patent Document 2).

PRIOR ART DOCUMENTS

Patent Documents (Patent Document 1) Japanese Unexamined Patent Application, First Publication No. 2009-41115
(Patent Document 2) Japanese Unexamined Patent Application, First Publication No. 2012-158835
(Patent Document 3) Japanese Patent No. 5869560

SUMMARY OF THE INVENTION

Problems to be Solved by the Invention

However, in the processing chamber, unnecessarily deposited deposits are generated, and there is a likelihood that these deposits will cause new particles to be generated. Particularly, there is a problem in that the number of particles generated from movable portions such as a swinging cathode is significant. Therefore, there is demand to solve this problem.

Further, since the weights of constituent components of magnets and/or cathodes are large, a drive system with high output power is required to swing the constituent components. Further, movable connection portions that supply cooling water, electric power, or the like are necessary for the above-described constituent components. In order for such an apparatus to be able to maintain a vacuum sealed state, there is a problem in that a vacuum sealed structure may become complicated, manufacturing costs may increase, and an overall volume of the apparatus may increase. Particularly, when a volume of such an apparatus performing a sputtering process for a large substrate increases, an increment in the volume affects a disposition of a building in which the processing apparatus is disposed. For this reason, space saving for a processing apparatus is required, and there is demand to solve such a problem.

Also, as disclosed in Patent Document 3, in recent years, since a deposition amount has tended to increase when a plurality of types of deposition process are consecutively performed, there has been a growing demand for further reducing an unnecessary deposition area which is a cause of generation of particles in a processing chamber.

The present invention has been made in view of the above circumstances, and is intended to achieve the following objects.

1. It is possible to move a target and a substrate relative to each other and uniformity of a film formed on a substrate is thereby maintained.
2. Space saving for an apparatus is achieved.
3. Reduction in the number of generated particles is achieved irrespective of an increase in deposition amount.
4. Deposition characteristics is maintained and the number of generated particles is reduced irrespective of driving on a cathode side which is a cause of particle generation.
5. Deterioration of film characteristics is prevented.

Means for Solving the Problems

A sputtering apparatus according to one aspect of the present invention is an apparatus performing deposition on a substrate to be processed using a sputtering method, and the sputtering apparatus includes a vacuum chamber, a target provided on a surface of a cathode provided in the vacuum chamber, a substrate holder provided in the vacuum chamber to face the target and on which the substrate to be processed is placed, and a swing unit that causes the substrate holder to be swingable with respect to the target, in which a swing region of the substrate to be processed in the substrate holder is set to be smaller than an erosion region of the target.

In the sputtering apparatus according to one aspect of the present invention, the substrate holder may include a vertical deposition preventing plate that is disposed at both end positions of the substrate to be processed in a swing direction of the substrate holder and extends in a direction intersecting the swing direction.

In the sputtering apparatus according to one aspect of the present invention, the vacuum chamber may include a lateral deposition preventing plate that is disposed at an end portion of the vertical deposition preventing plate in the direction intersecting the swing direction, is disposed at both end positions of the substrate to be processed, and is configured to be not in synchronism with swinging of the substrate holder.

In the sputtering apparatus according to one aspect of the present invention, a length of the vertical deposition preventing plate may be set to be larger than a length between the lateral deposition preventing plates facing each other in the direction intersecting the swing direction.

In the sputtering apparatus according to one aspect of the present invention, a length in the swing direction of the lateral deposition preventing plate may be set to be larger than an outer boundary length of a swing range of the vertical deposition preventing plate in the swing direction.

In the sputtering apparatus according to one aspect of the present invention, a length of the lateral deposition preventing plate in the swing direction may be set to be smaller than a length of the target in the swing direction.

In the sputtering apparatus according to one aspect of the present invention, the swing unit may include a swing shaft extending in the swing direction and may include a swing drive unit which swings the substrate holder in an axial direction of the swing shaft.

In the sputtering apparatus according to one aspect of the present invention, a rotation drive unit which causes the substrate holder connected to the rotation drive unit which is able to rotate the swing shaft around an axis to be rotatable between a horizontal placement position in which the substrate to be processed in a substantially horizontal position is placed thereon or taken out and a vertical processing position in which a processing surface of the substrate to be processed is raised upward in a substantially vertical direction due to rotation of the swing shaft may be provided in the swing shaft.

In the sputtering apparatus according to one aspect of the present invention, a magnetron magnetic circuit disposed on a back surface of the cathode and configured to generate magnetron plasma, and a magnetic circuit swing unit which swings the magnetron magnetic circuit with respect to the back surface of the cathode and causes plasma, when the magnetron plasma is generated in accordance therewith, to move on a surface of the target may be further provided.

A sputtering apparatus according to one aspect of the present invention is an apparatus performing deposition on a substrate to be processed using a sputtering method, and the sputtering apparatus includes a vacuum chamber, a target provided on a surface of a cathode provided in the vacuum chamber, a substrate holder provided in the vacuum chamber to face the target and on which the substrate to be processed is placed, and a swing unit that causes the substrate holder to be swingable with respect to the target, in which a swing region of the substrate to be processed in the substrate holder is set to be smaller than an erosion region of the target. Thereby, deposition can be performed while changing a relative position between the substrate to be processed and the target without swinging the target. Therefore, deposition uniformity can be maintained without providing a configuration in which the target is swung. Thereby, the number of particles generated from deposits or the like accompanying deposition in the vacuum chamber can be extremely reduced as compared with a case in which a configuration of swinging a target is provided and space saving for the apparatus can be achieved.

For example, a sputtering apparatus including a swing type target in which a target swings is known. In the apparatus employing the swing type target, not only a target but also a wiring connected to the target and a housing (internal chamber) surrounding a magnetic circuit are provided in a deposition chamber. The housing exposes a surface of the target to a front space. This housing is a swing part, and the housing also swings in the deposition chamber when the target swings.

In a case of a configuration in which such a swing type target is provided, not only deposits accompanying deposition are deposited on a surface of a region shown by hatched lines in FIG. 12, but also deposits are also deposited on side surfaces or a back surface of the housing not facing a glass substrate. In other words, in a structure in which a swing type target is provided, a surface area on which deposits are deposited is large.

On the other hand, according to the sputtering apparatus according to one aspect of the present invention, deposits accompanying deposition are deposited only on the surface of the region shown by the hatched lines in FIG. 12. In other words, unlike the swing type target, since a housing is not provided, deposits are not deposited on side surfaces or a back surface of a housing. That is, a surface area on which deposits are deposited can be reduced.

As an example, in the present embodiment, an area in which deposits adhere to a swing part can be reduced to approximately ⅔ to ½ as compared with that in the case of the swing type target.

In this example, an area to which deposits adhere can be reduced to approximately 1.5 to 2 times an area of a swing part constituting the swing type target.

Thereby, the number of generated particles can be reduced and occurrence of defective deposition due to an influence of particles can be reduced. Further, even when a deposition amount increases, improving a yield, improving workability due to reduced maintenance time of the apparatus, and improving an operation rate of the apparatus are achieved, and thereby an effect of reducing manufacturing costs can be achieved.

In the sputtering apparatus according to one aspect of the present invention, the substrate holder includes a vertical deposition preventing plate that is disposed at both end positions of the substrate to be processed in a swing direction of the substrate holder and extends in a direction intersecting the swing direction. Thereby, when the substrate to be processed is swung, by covering a region other than the substrate to be processed in which deposition particles reach from the target with the vertical deposition preventing plate, a deposition material is prevented from directly adhering to the substrate holder.

In the sputtering apparatus according to one aspect of the present invention, the vacuum chamber includes a lateral deposition preventing plate that is disposed at an end portion of the vertical deposition preventing plate in the direction intersecting the swing direction, is disposed at both end positions of the substrate to be processed, and is configured to be not in synchronism with swinging of the substrate holder. Thereby, peripheral edge portions of two sides in the vertical direction which are at positions opposite to each other in the substrate to be processed having a rectangular contour are covered with the vertical deposition preventing plate. In a state in which an edge portion of the substrate to be processed extending in the lateral direction is covered with the lateral deposition preventing plate, deposition on the substrate to be processed can be performed. Moreover, the lateral deposition preventing plate is disposed at a position corresponding to an end portion of the target in a direction perpendicular to the swing direction. Further, the lateral deposition preventing plates cover the entire region of edge portions of the substrate to be processed at positions opposite to each other. Therefore, uniform deposition over the entire surface of the substrate to be processed can be performed by covering four sides of the substrate to be processed having a rectangular contour with the vertical deposition preventing plate and the lateral deposition preventing plates.

In the sputtering apparatus according to one aspect of the present invention, a length of the vertical deposition preventing plate is set to be larger than a length between the lateral deposition preventing plates facing each other in the direction intersecting the swing direction. Thereby, deposition particles sputtered out from the target reach the surface of the substrate to be processed disposed between the vertical deposition preventing plates facing each other. In the substrate to be processed, a surface on which deposition particles reach is a deposition region. In the deposition region, uniform deposition is possible. An outer region positioned over the entire periphery of the substrate to be processed, which is a non-deposition region of the substrate to be processed, can be covered with the vertical deposition preventing plate and the lateral deposition preventing plate.

Further, a length in the swing direction of the lateral deposition preventing plate is set to be larger than an outer boundary length of a swing range of the vertical deposition preventing plate in the swing direction. Thereby, since the entire swing range of the vertical deposition preventing plate can be covered with the lateral deposition preventing plate, a state in which end portions of the substrate to be processed in a direction perpendicular to the swing direction and the vertical deposition preventing plate are covered can be maintained even when the substrate to be processed is swung during deposition processing.

Further, a length of the lateral deposition preventing plate in the swing direction is set to be smaller than a length of the target in the swing direction. Thereby, uniform deposition is possible in the entire region in which the lateral deposition preventing plate extends in the swing direction. Accordingly, uniform deposition is possible over the entire surface of the substrate to be processed.

Here, a length of the target in the swing direction means a maximum length of a region in which deposition particles can be generated when the sputtering apparatus includes a plurality of targets.

Further, the length of the lateral deposition preventing plate may be set so that a distance between inner end portions of the lateral deposition preventing plates facing each other is at least smaller than a length of the target in a direction perpendicular to the swing direction, and a distance between outer end portions of the lateral deposition preventing plates facing each other can also be larger than a region in the swing direction of the target capable of generating deposition particles.

In the sputtering apparatus according to one aspect of the present invention, the swing unit includes a swing shaft extending in the swing direction and includes a swing drive unit which swings the substrate holder in an axial direction of the swing shaft. Accordingly, by disposing the swing drive unit outside the vacuum chamber and causing the swing shaft to perform reciprocating operation using the swing drive unit, the substrate holder in the vacuum chamber can be swung.

In the sputtering apparatus according to one aspect of the present invention, a rotation drive unit which causes the substrate holder connected to the rotation drive unit which is able to rotate the swing shaft around an axis to be rotatable between a horizontal placement position in which the substrate to be processed in a substantially horizontal position is placed thereon or taken out and a vertical processing position in which a processing surface of the substrate to be processed is raised upward in a substantially vertical direction due to rotation of the swing shaft is provided in the swing shaft. As a result, the rotation drive unit is disposed outside the vacuum chamber and the swing shaft performs a rotating operation due to the rotation drive unit. Accordingly, the substrate holder is rotated in the vacuum chamber, the substrate to be processed is placed on and taken out from the substrate holder at the horizontal placement position, and the processing surface of the substrate to be processed held by the substrate holder is raised upward in a substantially vertical direction to be a state of facing the target and is swung so that deposition is possible at the vertical processing position.

The sputtering apparatus according to one aspect of the present invention includes a magnetron magnetic circuit disposed on a back surface of the cathode and configured to generate magnetron plasma, and a magnetic circuit swing unit which swings the magnetron magnetic circuit with respect to the back surface of the cathode and causes plasma, when the magnetron plasma is generated in accordance therewith, to move on a surface of the target. Thereby, deposition uniformity can be achieved by swinging the substrate to be processed in magnetron sputtering. At this time, deposition can be suitably performed by setting swing of the magnetron magnetic circuit and swing of the substrate to be processed to a predetermined speed and swing range.

Specifically, it is possible to set a swing range of the substrate to be processed to be smaller than a swing range of the magnetron magnetic circuit. Alternatively, it is possible to set a swing period of the substrate to be processed to be longer than a swing period of the magnetron magnetic circuit.

Effects of the Invention

According to the aspect of the present invention, it is possible to achieve effects of improving a yield while being able to cope with an increase in deposition amount by reducing the number of particles generated in the vacuum chamber and simultaneously improving deposition uniformity in a state in which the substrate to be processed and the target are swung, and achieving space saving by reducing a volume of the apparatus.

EMBODIMENTS FOR CARRYING OUT THE INVENTION

Hereinafter, a sputtering apparatus according to an embodiment of the present invention will be described with reference to the drawings. The present embodiment is specifically explained for appropriate understanding the scope of the present invention, and does not limit the present invention unless otherwise specified.

Figure 1:
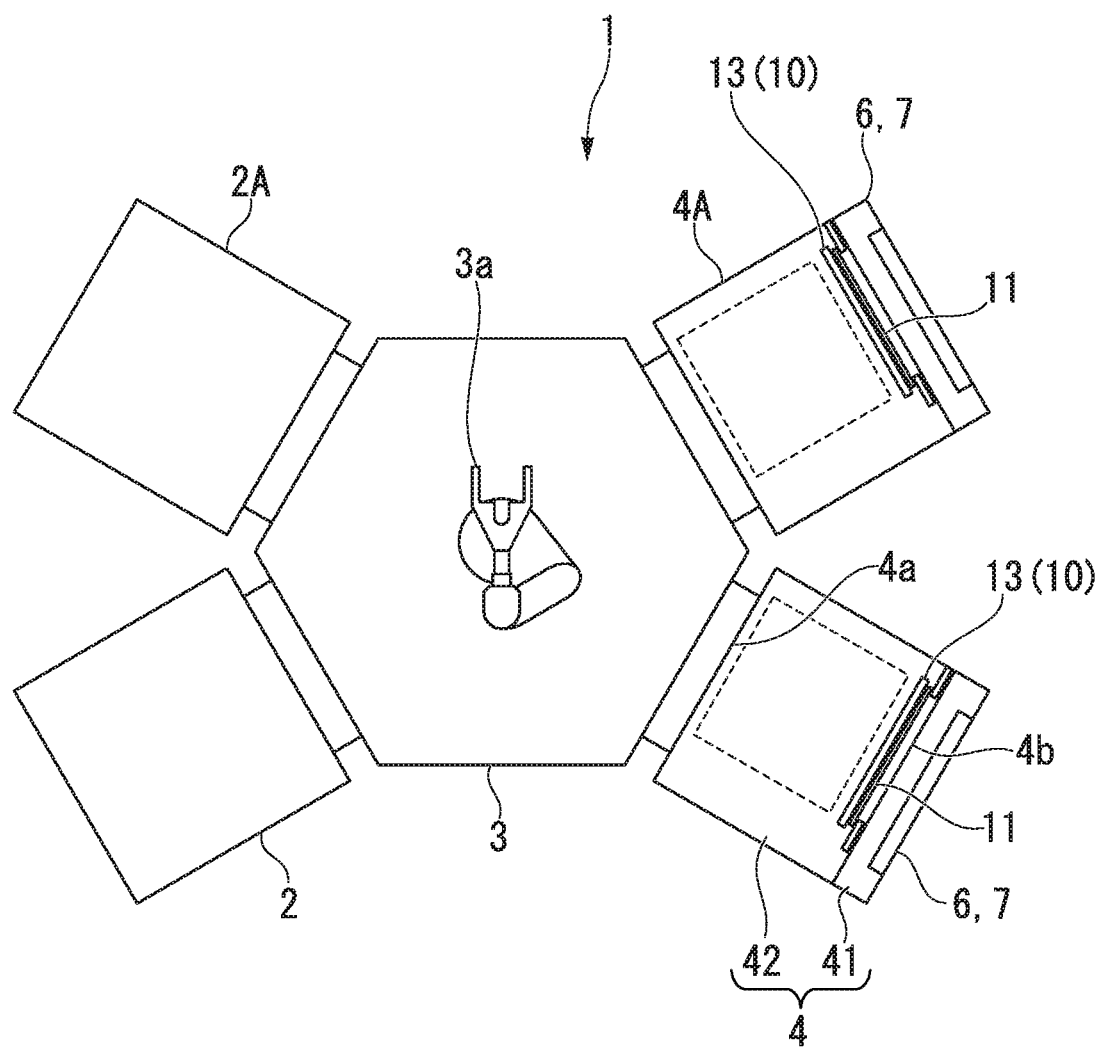
FIG. 1 is a schematic plan view showing a sputtering apparatus according to an embodiment of the present embodiment.

FIG. 1 is a schematic plan view showing a sputtering apparatus according to the present embodiment, and reference numeral 1 in FIG. 1 denotes a sputtering apparatus.

The sputtering apparatus 1 according to the present embodiment is an inter-back type vacuum processing apparatus that performs thermal processing, deposition processing, etching processing, or the like on a substrate to be processed made of glass or a resin in a vacuum environment, for example, in a case in which a thin film transistor (TFT) is formed on a substrate made of glass or the like in a manufacturing process of a liquid crystal display.

As shown in FIG. 1, the sputtering apparatus 1 includes a loading/unloading chamber 2 into and from which a substantially rectangular glass substrate 11 (substrate to be processed) is loaded and unloaded, a pressure-resistant deposition chamber 4 (vacuum chamber) in which a film such as a ZnO-based, $In_2O_3$-based transparent conductive film, or the like is formed on the glass substrate 11 using a sputtering method, and a transfer chamber 3 positioned between the deposition chamber 4 and the loading/unloading chamber 2 (vacuum chamber). In FIG. 1, although the sputtering apparatus 1 according to the present embodiment is shown as a side sputtering type, a sputter-down type or a sputter-up type can also be used.

Further, a deposition chamber 4A (vacuum chamber) and a loading/unloading chamber 2A (vacuum chamber) are provided in the sputtering apparatus 1. The plurality of chambers 2, 2A, 4, and 4A are formed to surround a periphery of the transfer chamber 3. Such chambers are constituted to include, for example, two loading/unloading chambers (vacuum chambers) formed adjacent to each other, and a plurality of processing chambers (vacuum chambers). For example, one loading/unloading chamber 2 is a loading chamber that loads the glass substrate 11 from the outside toward the inside of the sputtering apparatus 1 (vacuum processing apparatus), and the other loading/unloading chamber 2A is an unloading chamber that unloads the glass substrate 11 from the inside of the sputtering apparatus 1 to the outside. Also, a configuration in which the deposition chamber 4 and the deposition chamber 4A perform different deposition processes may be employed.

A gate valve may be formed between each of these chambers 2, 2A, 4, and 4A, and the transfer chamber 3.

In the loading/unloading chamber 2, a positioning member capable of setting and aligning a placing position of the glass substrate 11 loaded in from the outside of the sputtering apparatus 1 may be disposed.

In the loading/unloading chamber 2, a rough evacuation device (rough evacuation means, low-vacuum evacuation device) such as a rotary pump that vacuum-evacuates the inside of the chamber to a rough vacuum is provided.

As shown in FIG. 1, a transfer device 3a (transfer robot) is disposed inside the transfer chamber 3.

The transfer device 3a includes a rotating shaft, a robot arm attached to the rotating shaft, a robot hand formed at one end of the robot arm, and a vertically moving device that vertically moves the robot hand. The robot arm is constituted by first and second active arms bendable with each other and first and second driven arms. The transfer device 3a can move the glass substrate 11 which is an object to be transferred between each of the chambers 2, 2A, 4, and 4A, and the transfer chamber 3.

Figure 2:
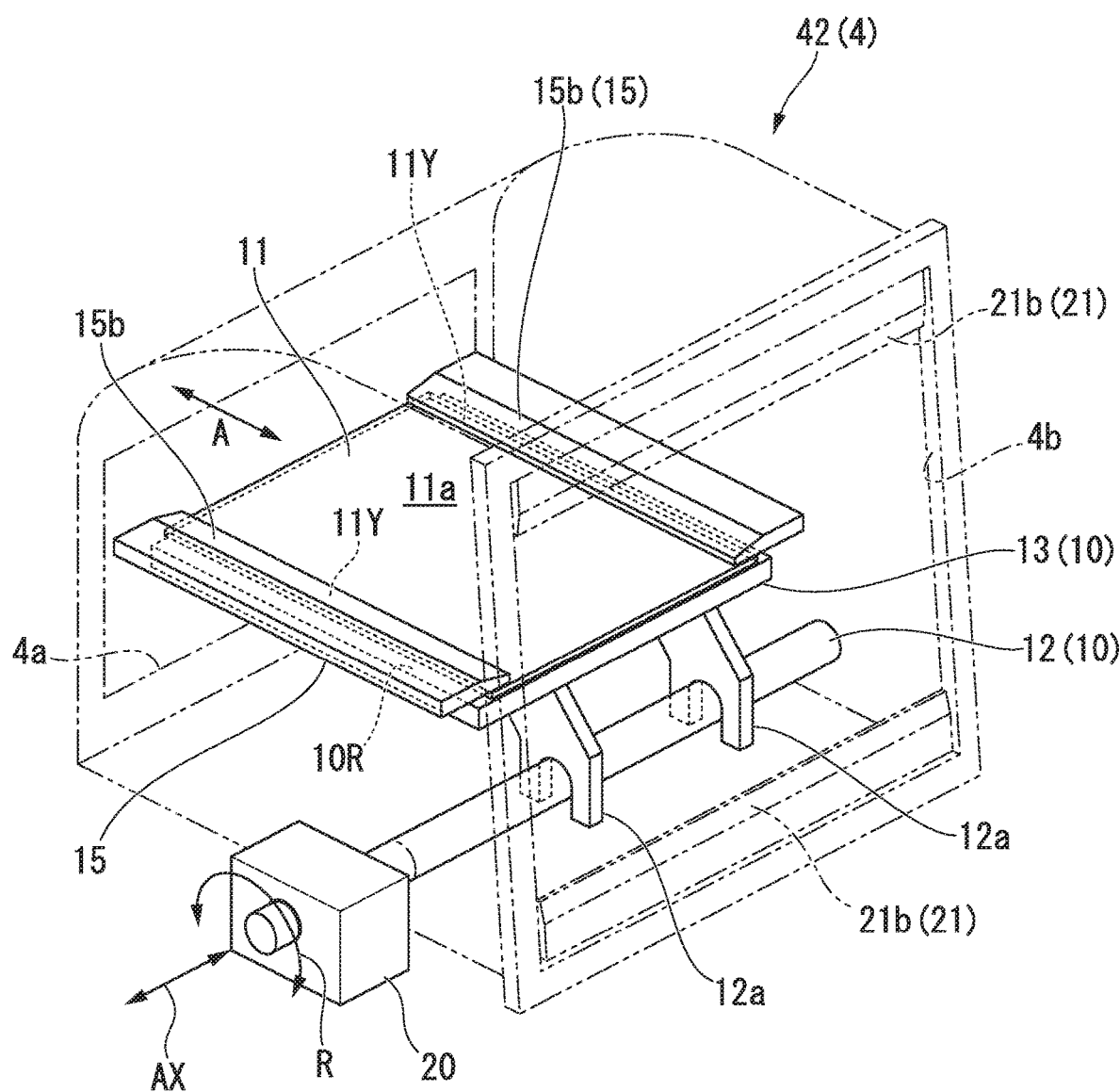
FIG. 2 is a perspective view showing a portion of a deposition chamber in the sputtering apparatus according to the embodiment of the present embodiment.
Figure 3:
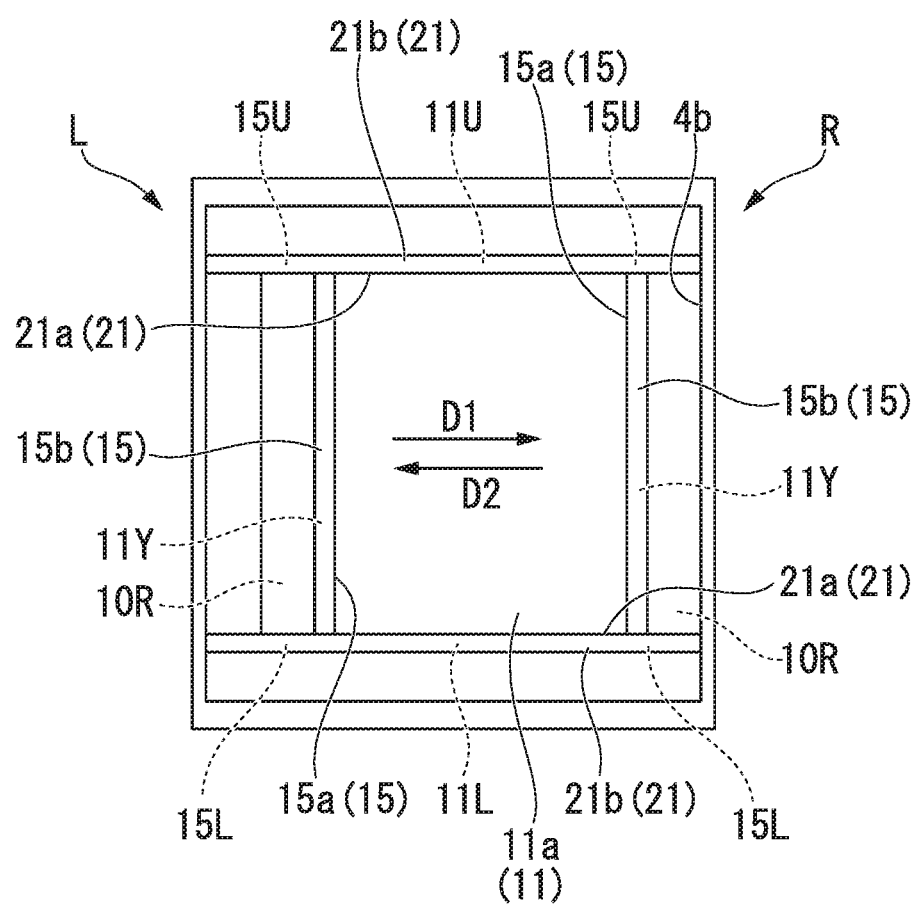
FIG. 3 is a front view showing swing of deposition preventing plates in the sputtering apparatus according to the embodiment of the present invention.

FIG. 2 is a perspective view showing a portion of the deposition chamber in the present embodiment, and FIG. 3 is a front view showing a deposition port portion of the deposition chamber in the present embodiment.

As shown in FIGS. 1 and 2, a backing plate 6 (a cathode, a cathode electrode) which functions as a supplying device that supplies a deposition material (supplying means) and holds a target 7 provided to stand, a power supply which applies a sputtering voltage of a negative potential to the backing plate 6, a gas introduction device (gas introduction means) which introduces a gas into the chamber, and a high-vacuum evacuation device (high-vacuum evacuation means) such as a turbo molecular pump or the like which vacuum-evacuates the inside of the deposition chamber 4 to a high vacuum are provided inside the deposition chamber 4. Inside the deposition chamber 4, the backing plate 6 is provided to stand at a position farthest from a transfer port 4a of the transfer chamber 3 (see FIG. 4).

The target 7 is fixed on a front surface side of the backing plate 6 which faces the glass substrate 11 substantially in parallel. The backing plate 6 serves as an electrode that applies a sputtering voltage of a negative potential to the target 7. The backing plate 6 is connected to the power supply that applies a sputtering voltage of a negative potential.

Figure 12:
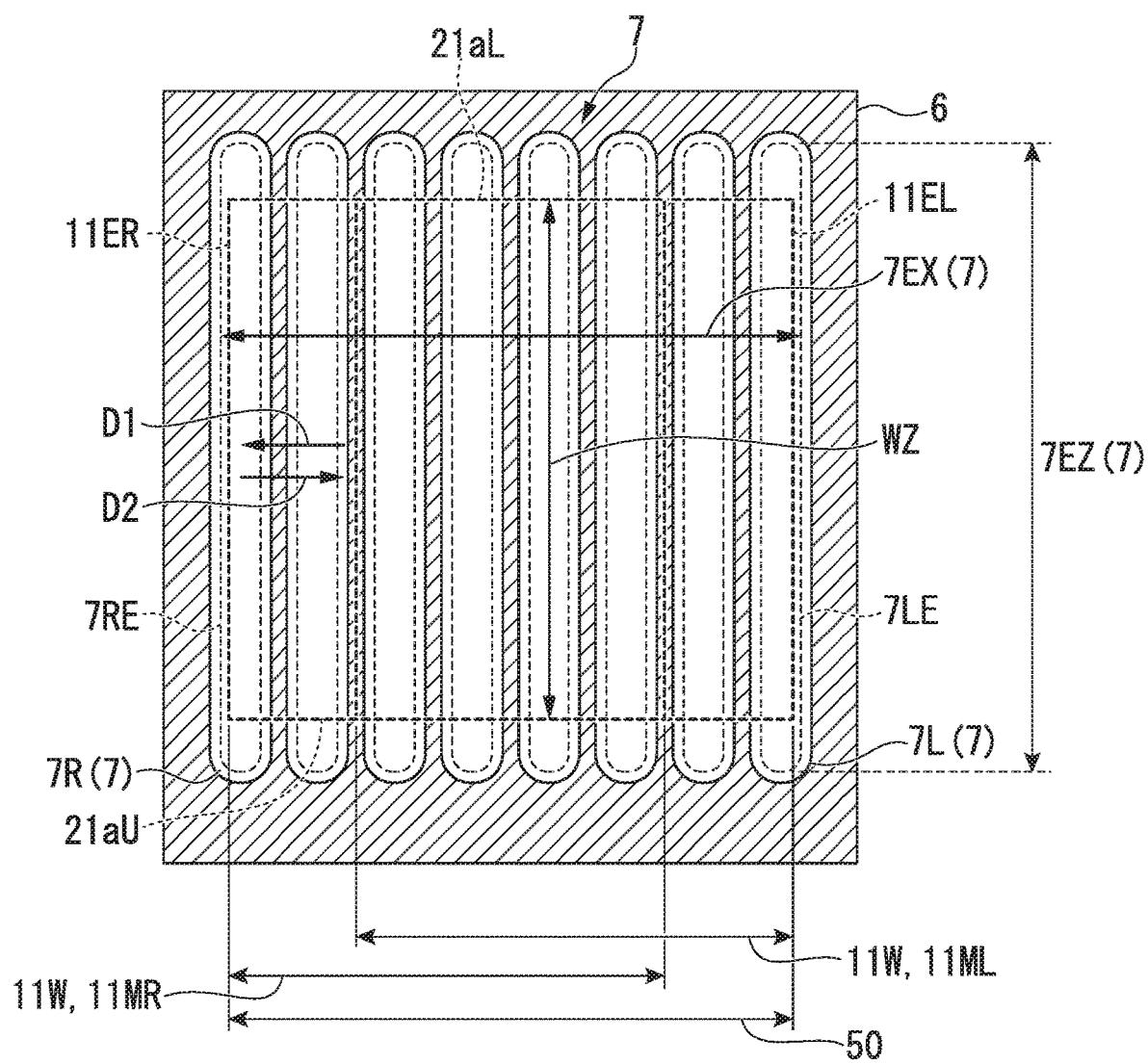
FIG. 12 is a schematic front view showing a relationship between a target and a swing region in which a substrate swings relative to the target in the sputtering apparatus according to the embodiment of the present invention.

On a back side (back side of the cathode) of the backing plate 6, a magnetron magnetic circuit that forms a predetermined magnetic field on the target 7 and generating magnetron plasma is installed. Also, the magnetron magnetic circuit is mounted on a swing mechanism and is configured to be swingable by a driving device for magnetic circuit swing. Further, as shown in FIG. 12 to be described below, the target 7 is constituted by a plurality of long targets each having a track shape which are arranged side by side. FIG. 12 shows eight long targets, but the number of long targets is not limited to eight.

Further, the sputtering apparatus 1 according to the present embodiment may include a magnetic circuit swing unit. The magnetic circuit swing unit swings the magnetron magnetic circuit with respect to the back side of the backing plate 6 and causes plasma, when the magnetron plasma is generated in accordance therewith, to move on a surface of the target 7.

As shown in FIG. 1, the inside of the deposition chamber 4 is constituted by a front space 41 in which a surface of the glass substrate 11 is exposed during deposition and a back space 42 positioned on a back surface side of the glass substrate 11. In the front space 41, the backing plate 6 to which the target 7 is fixed is disposed.

As shown in FIGS. 1 and 2, a deposition port 4b which opens to the front space 41 is provided in the back space 42 of the deposition chamber 4.

As shown in FIGS. 1 and 2, a substrate holder 10 (substrate holding means) that holds the glass substrate 11 to be swingable in a lateral direction (a direction indicated by reference numeral AX) so that the target 7 and a processing surface 11a face each other during deposition is provided inside the back space 42.

As shown in FIGS. 2 and 3, the substrate holder 10 includes a swing shaft 12 extending substantially parallel to the transfer port 4a and/or the deposition port 4b at a position below the back space 42, a holding portion 13 attached to the swing shaft 12 and holding a back surface of the glass substrate 11, and a vertical deposition preventing plate 15 (first deposition preventing plate) facing the holding portion 13 to cover a vertical edge portion 11Y of the glass substrate 11 and a region 10R in the substrate holder 10 to which a deposition material adheres. The substrate holder 10 such as the swing shaft 12 and a lateral deposition preventing plate 21 (second deposition preventing plate) constitute a swing unit (swinging means).

Particularly, the vertical deposition preventing plate 15 is disposed at both end positions of the glass substrate 11 in a swing direction indicated by reference numeral AX and extends in a direction intersecting the swing direction.

Also, in the deposition chamber 4, the lateral deposition preventing plate 21 is provided at each of an upper position and a lower position of the deposition port 4b. The lateral deposition preventing plate 21 is disposed at end portions of the vertical deposition preventing plate 15 in a direction intersecting the swing direction indicated by reference numeral AX, disposed at both end positions of the glass substrate 11, and is not in synchronism with swinging of the substrate holder 10.

The length of the vertical deposition preventing plate 15 is larger than a length between the lateral deposition preventing plates 21 facing each other in a direction intersecting the swing direction indicated by reference numeral AX.

As shown in FIG. 2, a swing drive unit 20 (rotation drive unit) is connected to the swing shaft 12 and is swingable in the axial direction AX. Also, the swing drive unit 20 serves also as a rotation drive unit that rotates the swing shaft 12 around the axis (a rotation direction indicated by reference numeral R) while swinging the swing shaft 12 at the same time. The swing drive unit 20 (rotation drive unit) is disposed outside the deposition chamber (vacuum chamber).

A substantially rectangular flat plate-shaped holding portion 13 is attached to the swing shaft 12 via an attachment member 12a. A planar position of the holding portion 13 does not coincide with an axial position of the swing shaft 12. According to rotation (rotation direction R) of the swing shaft 12 around the axis thereof and swinging in the axial direction AX, the holding portion 13 can move the glass substrate 11 held thereby.

As shown in FIG. 2, the holding portion 13 can perform a rotating operation by rotation of the swing shaft 12 around the axis thereof due to the rotation drive unit 20. On an upper side of the swing shaft 12, the rotating operation of the holding portion 13 is performed between a horizontal placement position at which the holding portion 13 is disposed in a substantially horizontal direction and a vertical processing position at which the holding portion 13 is disposed to rise in a substantially vertical direction.

The transfer port 4a is positioned on an extended line of a surface of the holding portion 13 disposed at the horizontal placement position. At the horizontal placement position, the holding portion 13 can place the glass substrate 11 transferred from the transfer chamber 3 thereon.

The surface of the holding portion 13 disposed at the vertical processing position is positioned to close the deposition port 4b substantially. In this case, the surface of the glass substrate 11 faces the backing plate 6 so that deposition on the surface of the glass substrate 11 is possible. When the holding portion 13 is disposed at the vertical processing position, the holding portion 13 is swingable in the lateral direction (direction indicated by reference numeral AX) of the deposition port 4b due to the swing shaft 12 swinging in the axial direction by the swing drive unit 20.

As shown in FIG. 2, the substrate holder 10 is provided on the holding portion 13. Also, lift pins (not shown) and a lift pin moving unit (not shown) that vertically moves the lift pins are disposed in the substrate holder 10. When the glass substrate 11 is loaded or unloaded, the lift pins protrude upward from an upper surface of the holding portion 13 disposed at the horizontal placement position and support the glass substrate 11 on the upper side of the holding portion 13 by driving of the lift pin moving unit.

The lift pin moving unit can be configured to advance and retreat the lift pins in the vertical direction by a driving device such as a driving motor disposed outside the deposition chamber 4 (vacuum chamber). The lift pin moving unit can drive the lift pins in a state in which the chamber 4 is kept sealed. With this configuration, at the time of loading or unloading the glass substrate 11 into and from the deposition chamber 4, the glass substrate 11 can be freely delivered between the holding portion 13 and the robot hand of the transfer device 3a.

As shown in FIGS. 2 and 3, the vertical deposition preventing plate 15 is provided in parallel with the holding portion 13 disposed at the horizontal placement position. The two vertical deposition preventing plates 15 facing each other are disposed at both end positions in the lateral direction of the glass substrate 11 and are provided to extend in a vertical direction to cover the vertical edge portions 11Y.

The vertical deposition preventing plate 15 is movable so that the vertical deposition preventing plate 15 and the holding portion 13 are separated from and come close to each other. That is, the vertical deposition preventing plate 15 is provided so that a distance in which the vertical deposition preventing plate 15 and the holding portion 13 are separated is variable. At this time, while the vertical deposition preventing plate 15 and the holding portion 13 are maintained parallel to each other, the distance in which the vertical deposition preventing plate 15 and the holding portion 13 are separated changes in the vertical direction.

The substrate holder 10 can drive such that the distance in which the vertical deposition preventing plate 15 and the holding portion 13 are separated from each other is changed, and can hold and release the glass substrate 11 with the glass substrate 11 sandwiched between the vertical deposition preventing plate 15 and the holding portion 13.

The vertical deposition preventing plate 15 can be vertically moved while maintaining a state of being parallel to the holding portion 13 due to, for example, the lift pin moving unit (not shown) or the like.

As shown in FIGS. 2 and 3, the vertical deposition preventing plate 15 is formed in a shape along the vertical edge portion 11Y which forms both ends in the lateral direction of the glass substrate 11 so that the region 10R to which a deposition material is not desired to be adhered in the substrate holder 10 and a non-deposition region in a peripheral edge of the glass substrate 11 supported by the holding portion 13, which is the vertical edge portion 11Y, are covered.

The vertical deposition preventing plate 15 can be rotated in synchronism with the holding portion 13 by a rotating operation of the swing shaft 12 in a state in which the glass substrate 11 is sandwiched therebetween.

When the holding portion 13 is disposed at the vertical processing position, the vertical deposition preventing plate 15 is positioned to close the deposition port 4b substantially and is configured to swing in synchronism with a swing operation in the lateral direction of the holding portion 13. The shape of the vertical deposition preventing plate 15 in the lateral direction is set such that the vertical deposition preventing plate 15 do not come into contact with left and right ends of the deposition port 4b when the holding portion 13 is swung in the vertical processing position.

Further, the vertical deposition preventing plate 15 is configured not to be separated from the holding portion 13 during the rotating operation of the holding portion 13 and when the holding portion 13 is disposed at the vertical processing position.

Further, as a support that supports the glass substrate 11 while restricting a position of an end portion in the vertical direction of the glass substrate 11, a support frame integral with the vertical deposition preventing plate 15, a substrate guide integral with the holding portion 13, or the like can be provided in the substrate holder 10. Particularly, a structure capable of supporting the glass substrate 11 by being in contact with an outer peripheral end surface portion of the glass substrate 11 is preferably employed as the substrate guide.

As shown in FIGS. 2 and 3, the two lateral deposition preventing plates 21 disposed at an upper end position and a lower end position of the deposition port 4b to face each other are provided to extend in the lateral direction. End portions of the lateral deposition preventing plate 21 positioned close to a center of the deposition port 4b are disposed to cover an upper end 15U (end portion) and a lower end 15L (end portion) of the vertical deposition preventing plate 15, and edge portions 11U and 11L which are an upper end and a lower end of the glass substrate 11.

The lateral deposition preventing plate 21 is provided to cover a region from an upper end portion of an outer periphery of the substrate holder 10 to an upper end portion of an outer peripheral portion of the glass substrate 11, and a region from a lower end portion of the outer periphery of the substrate holder 10 to a lower end portion of the outer peripheral portion of the glass substrate 11 The lateral deposition preventing plate 21 is provided to cover a region to which particles sputtered out from the target 7 of the backing plate 6 adhere in a portion other than the glass substrate 11.

A length in the lateral direction of the lateral deposition preventing plate 21 is set to be equal to a length in the lateral direction of the deposition port 4b, and the lateral deposition preventing plate 21 extends over the entire length in the lateral direction of the deposition port 4b.

As shown in FIGS. 2 and 3, the vertical deposition preventing plate 15 and the lateral deposition preventing plate 21 are combined into a frame shape when the holding portion 13 is disposed at the vertical processing position. In this state, in a central portion surrounded by the vertical deposition preventing plate 15 and the lateral deposition preventing plate 21, openings 15a and 21a penetrating in a thickness direction of the vertical deposition preventing plate 15 are formed so that a deposition material reaches the processing surface 11a (surface) of the glass substrate 11. Of the vertical deposition preventing plate 15 and the lateral deposition preventing plate 21 forming edge portions of the openings 15a and 21a, inclined portions 15b and 21b are formed on a surface side portion of the vertical deposition preventing plate 15 and a surface side portion of the lateral deposition preventing plate 21 which face the backing plate 6. The inclined portions 15b and 21b have inclined surfaces in which thicknesses of the inclined portions 15b and 21b decrease in a direction from the outside to a center of the glass substrate 11. That is, the openings 15a and 21a are formed so that opening areas of the openings 15a and 21a are reduced in a direction from a surface side to a back surface side of the vertical deposition preventing plate 15 and the lateral deposition preventing plate 21, and thereby the inclined portions 15b and 21b are formed on inner peripheral surfaces of the openings 15a and 21a.

Next, in the sputtering apparatus 1 according to the present embodiment, deposition on the glass substrate 11 in a state in which the glass substrate 11 is held by the substrate holder 10 will be described.

First, the glass substrate 11 loaded from the outside to the inside of the sputtering apparatus 1 is placed on the positioning member in the loading/unloading chamber 2, and the glass substrate 11 is aligned to be disposed at a predetermined position on the positioning member.

Next, the glass substrate 11 placed on the positioning member of the loading/unloading chamber 2 is supported by the robot hand of the transfer device 3a (transfer robot) and is taken out from the loading/unloading chamber 2. Then, the glass substrate 11 is transferred to the deposition chamber 4 via the transfer chamber 3.

FIGS. 4 to 9 are schematic side views showing processes performed in the deposition chamber in the present embodiment. In FIGS. 4 to 9, descriptions of the portions such as the inclined portions 15b and 21b are omitted.

Figure 4:
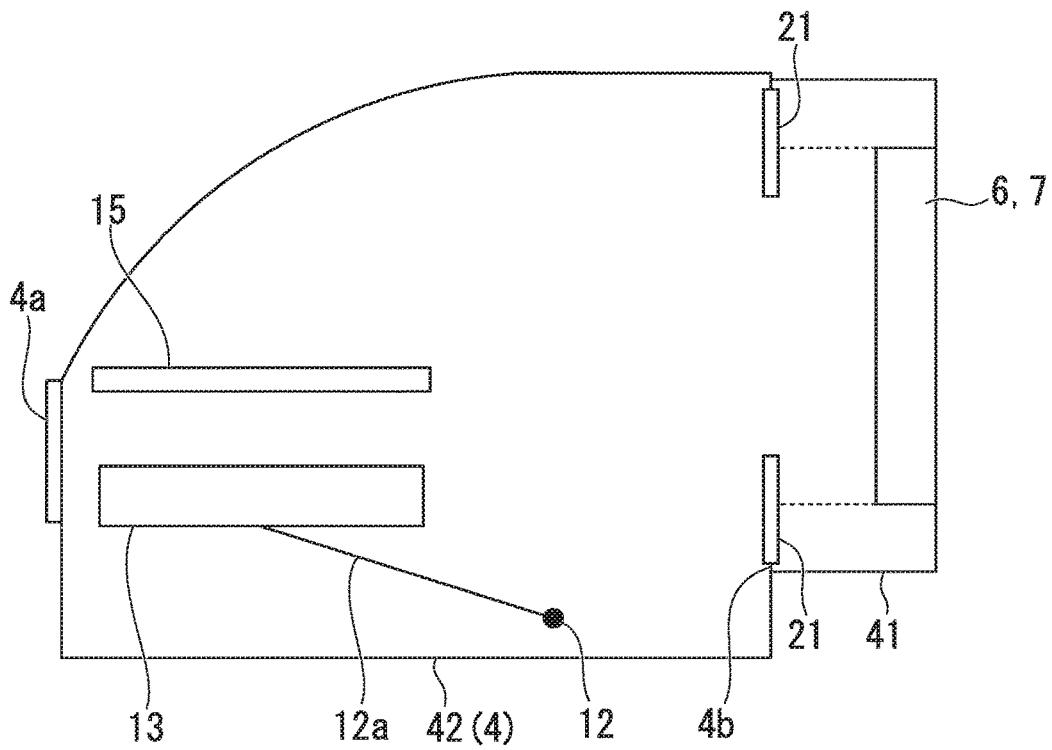
FIG. 4 is a schematic side view showing a process performed in the deposition chamber in the sputtering apparatus according to the embodiment of the present invention.

At this time, in the deposition chamber 4, as shown in FIG. 4, the swing shaft 12 is rotated by the rotation drive unit 20, and the holding portion 13 and the vertical deposition preventing plate 15 are placed at the horizontal placement position in the substrate holder 10. Further, the vertical deposition preventing plate 15 is disposed at a preparation position separated from the holding portion 13 by the lift pin moving unit (not shown).

In this state, the glass substrate 11 that has reached the deposition chamber 4 is placed on the holding portion 13 of the substrate holder 10 by the transfer device 3a (transfer robot).

Figure 5:
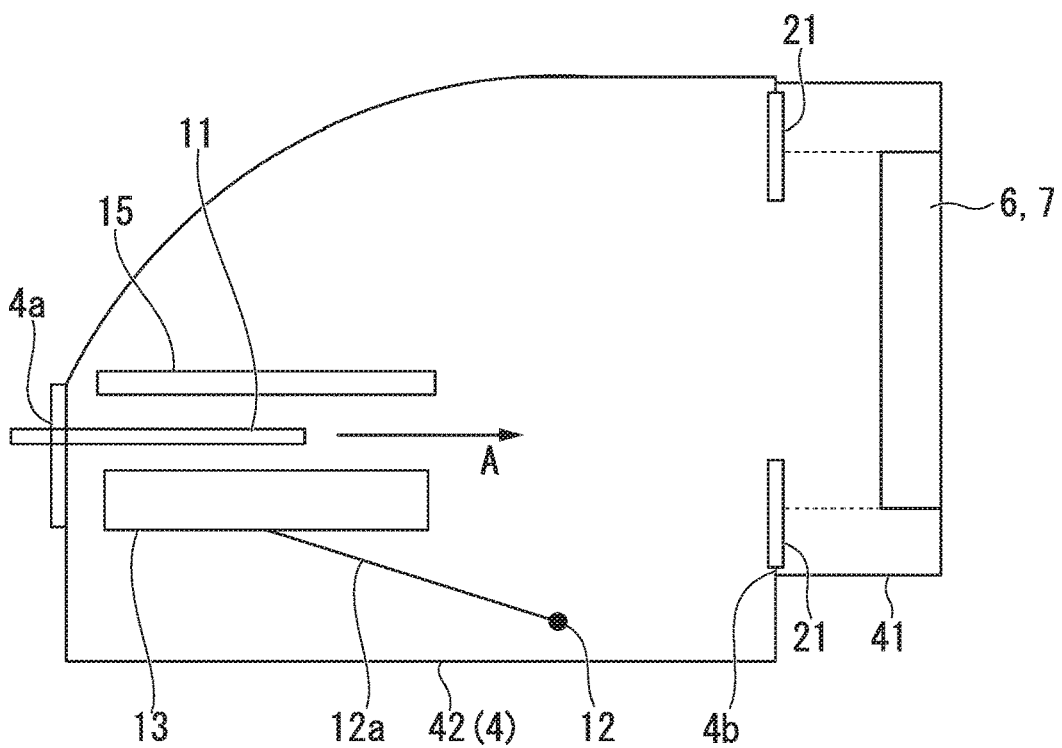
FIG. 5 is a schematic side view showing a process performed in the deposition chamber in the sputtering apparatus according to the embodiment of the present invention.

Specifically, first, the glass substrate 11 supported in a substantially parallel state with respect to the vertical deposition preventing plate 15 and the holding portion 13 by the transfer device 3a (transfer robot) is inserted from the outside to the inside in a direction parallel to the surface of the holding portion 13 between the holding portion 13 and the vertical deposition preventing plate 15 which are separated from each other as shown by an arrow A in FIG. 5. At this time, the lift pin moving unit moves the lift pins upward with respect to the surface of the holding portion 13, and the lift pins protrude upward with respect to the surface of the holding portion 13 in order to receive the glass substrate 11.

Figure 6:
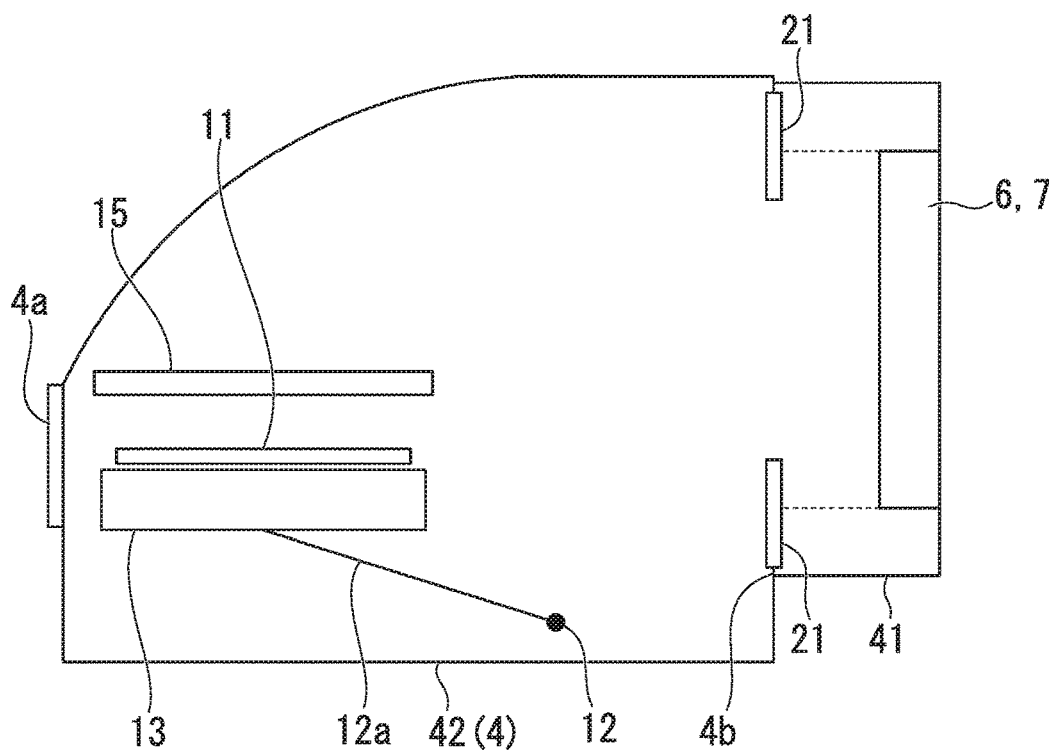
FIG. 6 is a schematic side view showing a process performed in the deposition chamber in the sputtering apparatus according to the embodiment of the present invention.

Next, as shown in FIG. 6, when the robot hand of the transfer device 3a (transfer robot) comes close to the holding portion 13, the glass substrate 11 is placed on the holding portion 13 with the glass substrate 11 aligned at a predetermined in-plane position of the holding portion 13. Here, after the delivery of the glass substrate 11 is performed, the arm of the transfer robot 3a retreats to the transfer chamber 3. Then, the lift pins of the lift pin moving unit provided in the substrate holder 10 are lowered, the glass substrate 11 is stored on a lower side of the holding portion 13, and thereby the glass substrate 11 is supported by the holding portion 13.

Figure 7:
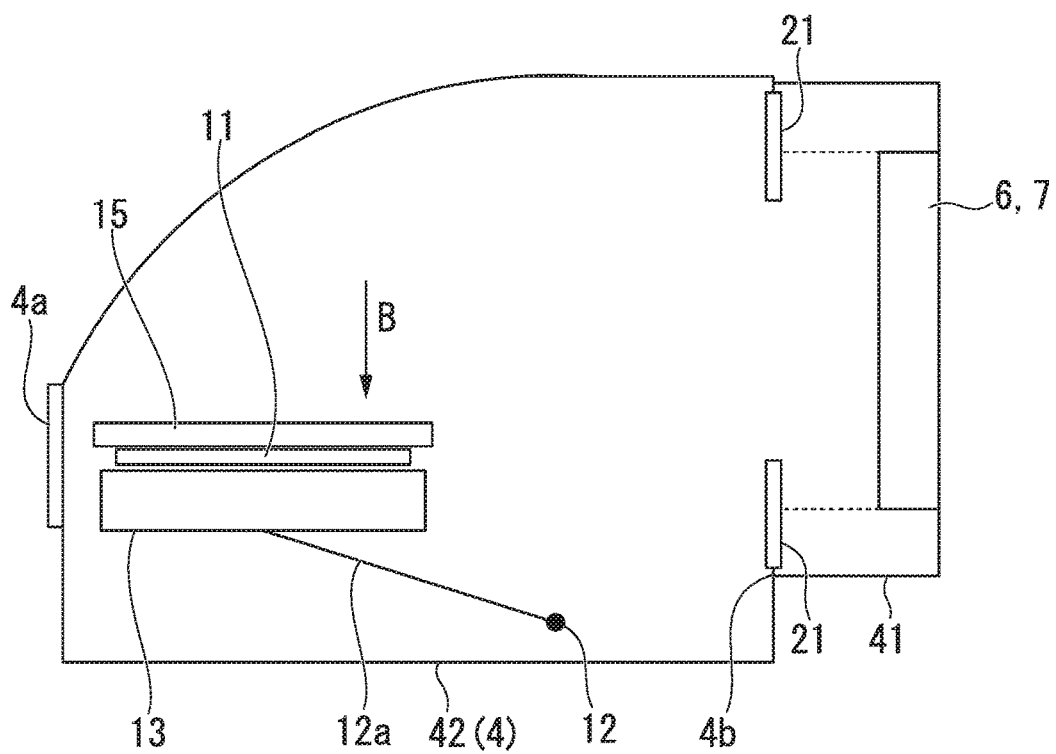
FIG. 7 is a schematic side view showing a process performed in the deposition chamber in the sputtering apparatus according to the embodiment of the present invention.

Next, as shown by an arrow B in FIG. 7, the vertical deposition preventing plate 15 is lowered and comes close to the holding portion 13 due to the lift pin moving unit (not shown).

When the vertical deposition preventing plate 15 is stopped, the surface and the back surface of the glass substrate 11 are sandwiched between the vertical deposition preventing plate 15 and the holding portion 13 by a support (not shown) or the like. In this state, the glass substrate 11 is held by the substrate holder 10 in a state of being aligned as a deposition processing position. At this time, the glass substrate 11 can also be supported by a substrate guide or the like provided in the vertical deposition preventing plate 15 or the holding portion 13.

Figure 8:
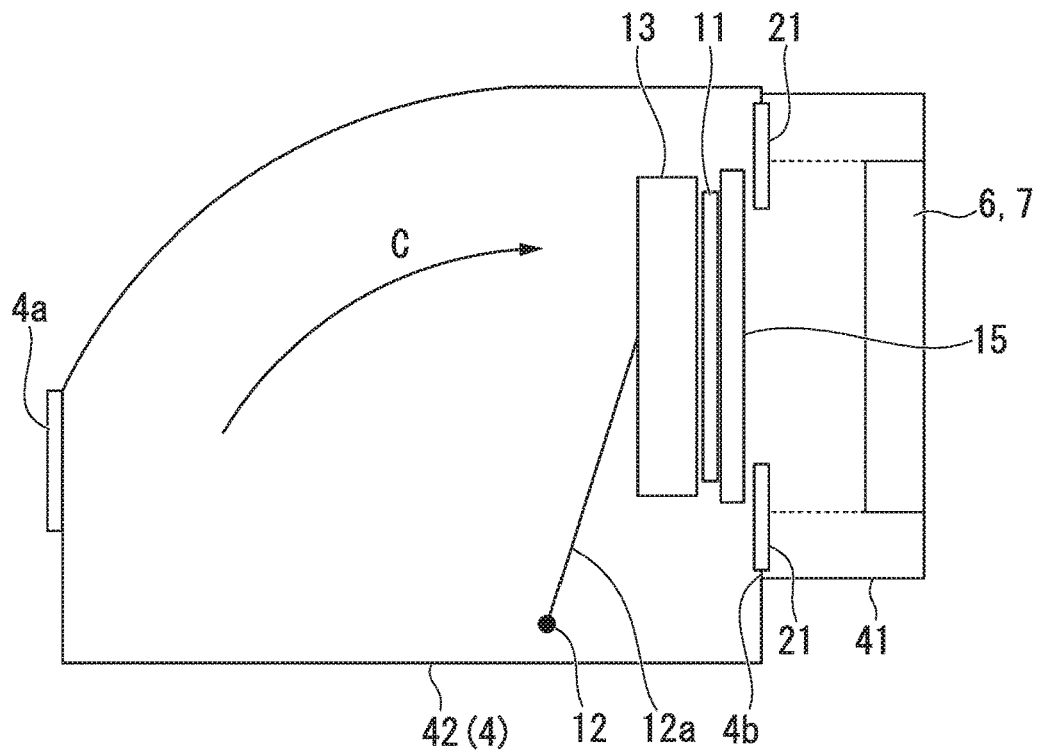
FIG. 8 is a schematic side view showing a process performed in the deposition chamber in the sputtering apparatus according to the embodiment of the present invention.

Next, when the swing shaft 12 is rotated by the rotation drive unit 20, as shown by an arrow C in FIG. 8, the holding portion 13 and the vertical deposition preventing plate 15 rotate around the axis of the swing shaft 12 and rise to reach the vertical processing position in a state in which the glass substrate 11 is held by the holding portion 13 and the vertical deposition preventing plate 15 which are attached to the swing shaft 12 via the attachment member 12a.

As a result, the deposition port 4b is substantially closed by the vertical deposition preventing plate 15 and the holding portion 13, and the vertical deposition preventing plate 15 comes close to the lateral deposition preventing plate 21.

The vertical deposition preventing plate 15 and the lateral deposition preventing plate 21 which have come close to each other are combined into a frame shape as shown in FIG. 3, and, the entire periphery of the peripheral edge portions of the processing surface 11a of the glass substrate 11 (the vertical edge portion 11Y, the edge portion 11U, and the edge portion 11L) is in a covered state with the frame-shaped vertical deposition preventing plate 15 and the lateral deposition preventing plate 21 so that a deposition material is not reached. Further, the glass substrate 11 exposed to the openings 15a and 21a formed by the frame-shaped vertical deposition preventing plate 15 and the lateral deposition preventing plate 21 is in a state of facing the target 7 of the backing plate 6.

The glass substrate 11 disposed at the vertical processing position and held by the substrate holder 10 is held in a state in which the surface 11a (processing surface) of the glass substrate 11 and a surface of the backing plate 6 are substantially parallel to each other, and in this state, a deposition process is performed in the deposition chamber 4.

In the deposition process, the gas introduction device supplies a sputtering gas and a reactive gas to the deposition chamber 4, and the external power supply applies a sputtering voltage to the backing plate 6. Also, a predetermined magnetic field is formed on the target 7 by the magnetron magnetic circuit. Ions of the sputtering gas excited by plasma in the front space 41 of the deposition chamber 4 collide with the target 7 of the backing plate 6 and cause particles of the deposition material to eject. Then, after the ejected particles and the reactive gas are combined, the particles adhere to the glass substrate 11, and thereby a predetermined film is formed on the surface of the glass substrate 11.

Figure 9:
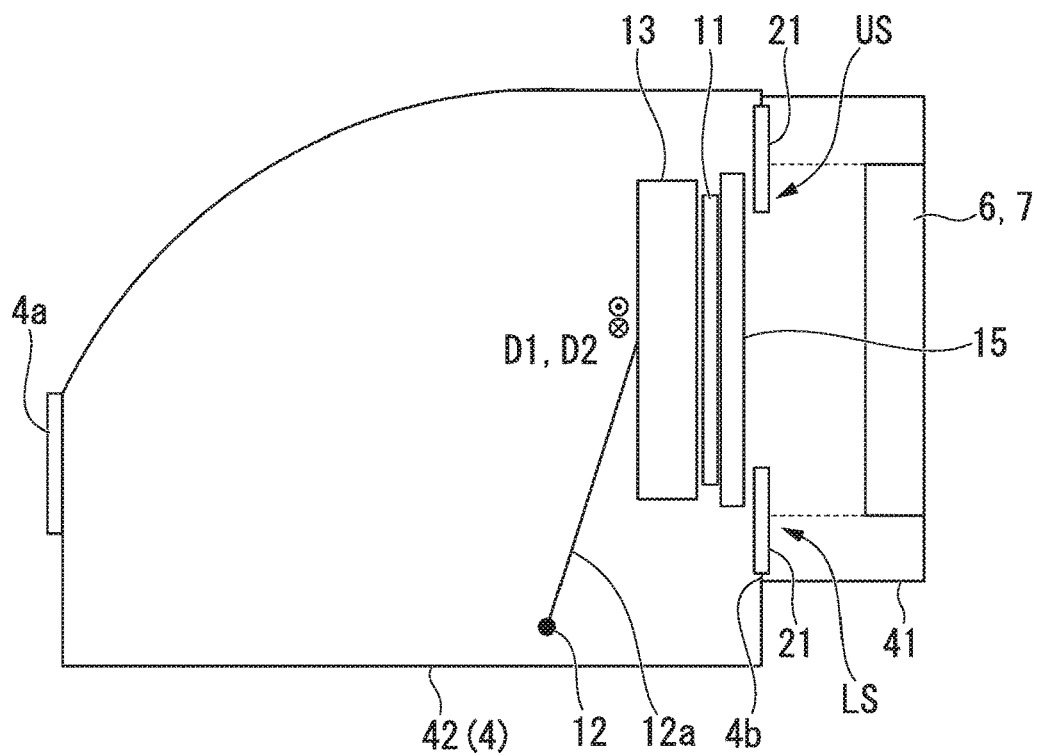
FIG. 9 is a schematic side view showing a process performed in the deposition chamber in the sputtering apparatus according to the embodiment of the present invention.

At this time, in the inter-back type reactive sputtering apparatus (sputtering apparatus 1) according to the present embodiment, in the deposition process, when the swing shaft 12 is swung in the axial direction by the swing drive unit 20, the holding portion 13 swings in the lateral direction as indicated by an arrow D in FIG. 9. Due to driving of the holding portion 13, the held glass substrate 11 moves relative to the backing plate 6 in the lateral direction.

Substrate swing in the deposition process will be described.

Figure 10:
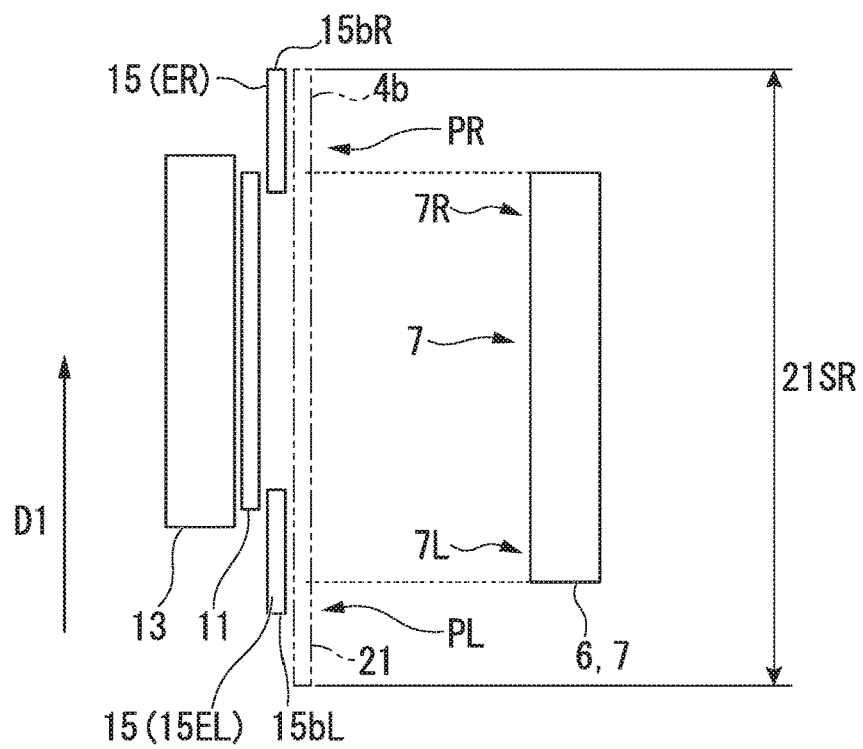
FIG. 10 is a schematic top view showing swing of a deposition preventing plate in the sputtering apparatus according to the embodiment of the present invention.
Figure 11:
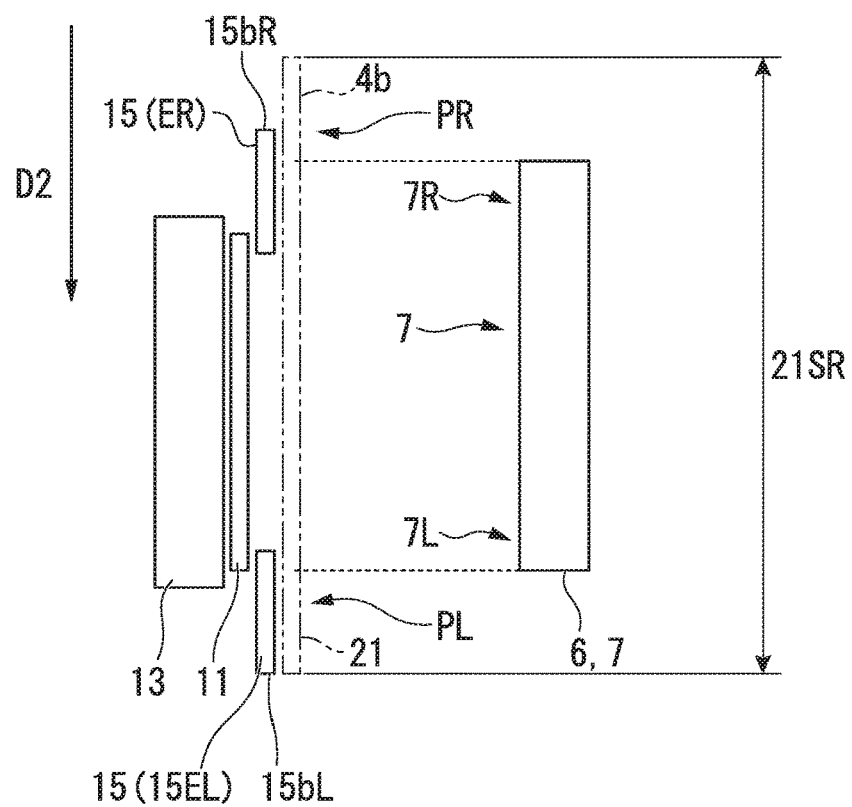
FIG. 11 is a schematic top view showing swing of the deposition preventing plate in the sputtering apparatus according to the embodiment of the present invention.

FIGS. 10 and 11 are schematic top views showing the swing of the deposition preventing plate (the vertical deposition preventing plate 15 and the lateral deposition preventing plate 21) in the present embodiment.

In the deposition process shown in FIGS. 10 and 11, the holding portion 13 performs a reciprocating operation as indicated by reference numerals D1 and D2. Specifically, when viewed from the backing plate 6 in FIG. 10, the holding portion 13 moves in a direction from a position PL of a left end portion of the deposition port 4b toward a position PR of a right end portion, that is, in a direction D1.

Further, when viewed from the backing plate 6 in FIG. 11, the holding portion 13 moves in a direction from the position PR of the right end portion of the deposition port 4b toward the position PL of the left end portion, that is, in a direction D2.

That is, in a region between the position PR and the position PL, the holding portion 13 performs a reciprocating operation in the D1 and D2 directions. Thereby, the glass substrate 11 held by the holding portion 13 and the backing plate 6 move relatively and thus in-plane uniformity of film characteristics of a sputtered film formed on the glass substrate 11 is maintained.

At this time, since an upper edge side US and a lower edge side LS of the deposition port 4b are closed by the lateral deposition preventing plate 21 as shown in FIG. 9, deposition particles are shielded by the lateral deposition preventing plate 21 and do not reach the back space 42. Also, the deposition particles do not adhere to the holding portion 13.

In addition, since a right edge side R and a left edge side L of the deposition port 4b are covered with the vertical deposition preventing plate 15 as shown in FIG. 3, the deposition particles are shielded by the vertical deposition preventing plate 15 and do not reach the back space 42. Also, the deposition particles do not adhere to the holding portion 13.

As a result, the deposition particles are prevented from entering the back space 42, and adhesion of the deposition particles to the holding portion 13 is prevented. Accordingly, the number of generated particles due to deposits of the deposition particles can be reduced.

Figure 13:
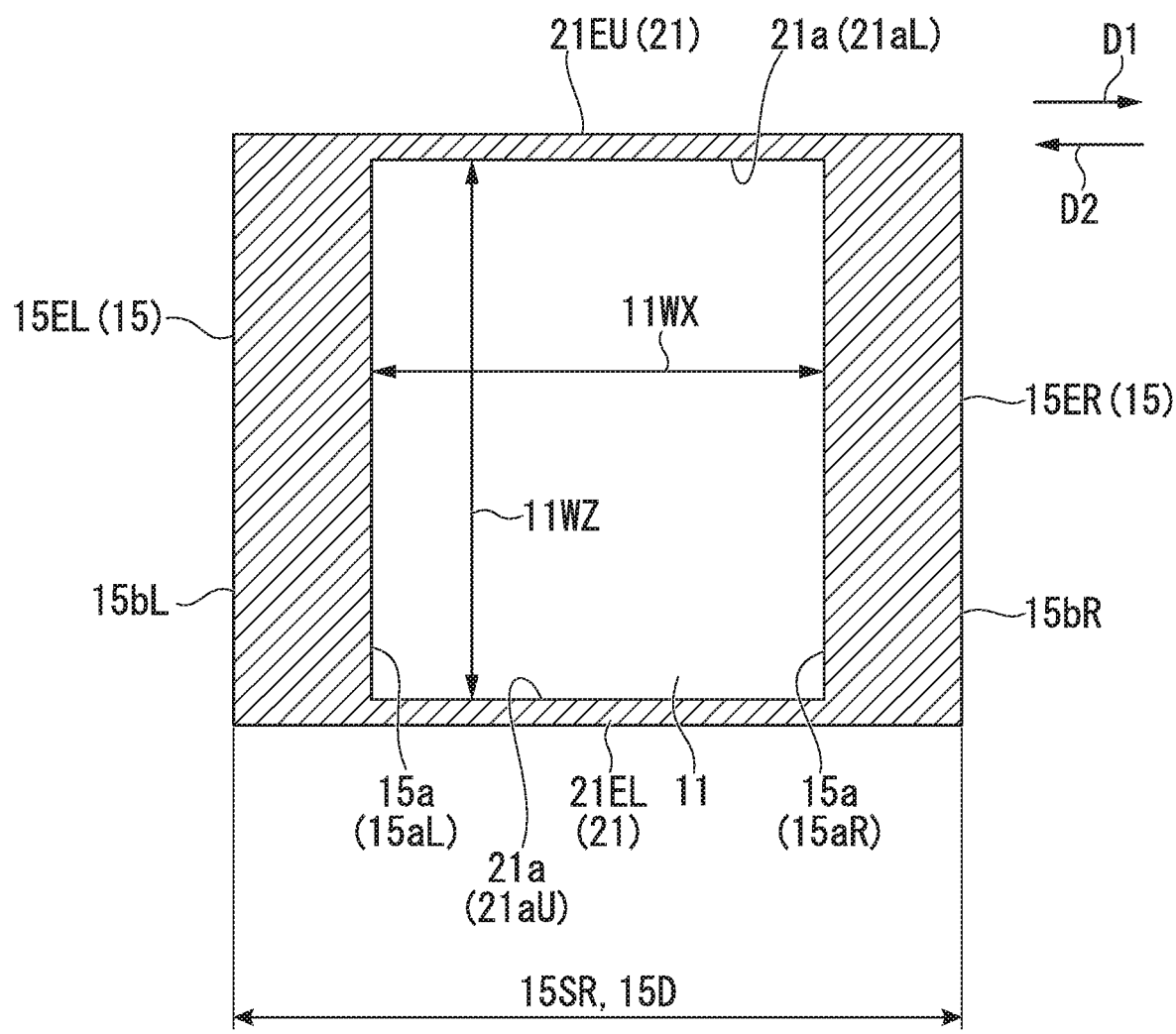
FIG. 13 is a schematic front view showing a relationship between the substrate and the deposition preventing plates in the sputtering apparatus according to the embodiment of the present invention.

FIG. 12 is a schematic front view showing a relationship between the target 7 and a region (swing region) in which the substrate swings relative to the target 7 in the present embodiment. FIG. 13 is a schematic front view showing a positional relationship between the glass substrate 11 and the deposition preventing plates (the vertical deposition preventing plate 15 and the lateral deposition preventing plate 21) in the present embodiment.

In FIG. 12, a position of the glass substrate 11 moving in accordance with reciprocating movement of the holding portion 13 and a position of the target 7 are superimposed.

In FIG. 13, portions in which the vertical deposition preventing plate 15 overlap the lateral deposition preventing plate 21 is omitted, and one deposition preventing plate in which the vertical deposition preventing plate 15 and the lateral deposition preventing plate 21 are integrally combined is shown.

As shown in FIG. 12, the target 7 has a configuration in which eight long targets having a track shape are arranged. In each of the long targets, a portion shown by a broken line on an inner side of an outer shape of the long target indicates erosion formed on an exposed surface of the target 7 by sputtering. The shape of the erosion also has a track shape.

Of the eight long targets constituting the target 7, a long target positioned close to the position PR (see FIGS. 10 and 11) of the deposition port 4b is a right end target 7R, and a long target positioned close to the position PL (see FIGS. 10 and 11) of the deposition port 4b is a left end target 7L.

A region from a right edge portion to a left edge portion of the target 7 and a region from an upper edge portion to a lower edge portion of the target 7 are an erosion region 7E. In the erosion region 7E, the region from the right edge portion to the left edge portion of the target 7 is a lateral length 7EX of the erosion region 7E, and the region from the upper edge portion to the lower edge portion of the target 7 is a vertical length 7EZ of the erosion region 7E.

The lateral length 7EX of the erosion region 7E corresponds to a distance between an erosion 7RE generated at the right edge portion of the right end target 7R and an erosion 7LE generated at the left edge portion of the left end target 7L.

As shown in FIG. 13, the glass substrate 11 is surrounded by the vertical deposition preventing plate 15 and the lateral deposition preventing plate 21, and exposed to the front space 41 through the openings 15a and 21a to face the target 7 as shown in FIG. 8.

Reference numeral 11WX denotes a distance between a left end 15aR of a right vertical deposition preventing plate 15ER (opening 15a) and a right end 15aL of a left vertical deposition preventing plate 15EL (opening 15a), that is, a lateral width of the glass substrate 11 (length in the lateral direction) exposed to the front space 41.

Reference numeral 11WZ denotes a distance between a lower end 21aL of an upper lateral deposition preventing plate 21EU (inner end portion, opening 21a) and an upper end 21aU of a lower lateral deposition preventing plate 21EL (inner end portion, opening 21a), that is a vertical width of the glass substrate 11 (length in the vertical direction) exposed to the front space 41.

Further, in FIG. 12, the lower end 21aL, the upper end 21aU, and the vertical width WZ of the glass substrate 11 are indicated by broken lines.

In FIG. 12, reference numeral 11MR denotes a position of the glass substrate 11 when the holding portion 13 moves in the D1 direction as shown in FIG. 10 and the holding portion 13 is closest to the position PR of the right end portion of the deposition port 4b.

In addition, reference numeral 11ML denotes a position of the glass substrate 11 when the holding portion 13 moves in the D2 direction as shown in FIG. 11 and the holding portion 13 is closest to the position PL of the left end portion of the deposition port 4b.

In each of the positions 11MR and 11ML of the glass substrate 11, the glass substrate 11 having the lateral width 11WX faces the target 7. That is, while the glass substrate 11 swings in accordance with the reciprocating operation of the holding portion 13 and repeatedly reaches the positions 11MR and 11ML, deposition particles ejected from the target 7 by sputtering are deposited on the glass substrate 11.

In FIG. 12, a region between a right end 11ER of the glass substrate 11 when the glass substrate 11 reaches the position 11MR and a left end 11EL of the glass substrate 11 when the glass substrate 11 reaches the position 11ML is a swing region 50. The swing region 50 means a region in which the glass substrate 11 is exposed to the front space 41 while the holding portion 13 performs reciprocating movement in the axial direction AX due to the swing drive unit 20.

As shown by a broken line in FIG. 12, the swing region 50 is set to be smaller than the lateral length 7EX of the erosion region 7E in the target 7. Here, the erosion region 7E of the target 7 means a region in which substantially uniform sputtering deposition can be achieved by deposition particles ejected from the target 7, and is irrespective of an actual contour of the target 7.

Next, a region in which the vertical deposition preventing plate 15 is exposed to the front space 41 in accordance with the swing of the glass substrate 11 in the swing region 50 will be described.

When the glass substrate 11 moves in the D1 direction as shown in FIGS. 10 and 12, a region of the left vertical deposition preventing plate 15EL exposed to the front space 41 gradually increases. Also, when the glass substrate 11 reaches the position 11MR, the region of the left vertical deposition preventing plate 15EL exposed to the front space 41 becomes the largest. At this time, since a left end 15bL of the left vertical deposition preventing plate 15EL shown in FIG. 13 is not exposed to the front space 41, particles sputtered out from the target 7 do not reach the front space 41 through a side surface of the left end 15bL.

Similarly, when the glass substrate 11 moves in the D2 direction as shown in FIGS. 11 and 12, a region of the right vertical deposition preventing plate 15ER exposed to the front space 41 gradually increases. Also, when the glass substrate 11 reaches the position 11ML, the region of the right vertical deposition preventing plate 15ER exposed to the front space 41 becomes the largest. At this time, since a right end 15bR of the right vertical deposition preventing plate 15ER shown in FIG. 13 is not exposed to the front space 41, particles sputtered out from the target 7 do not reach the front space 41 through a side surface of the right end 15bR.

Also, a region between the left end 15bL and the right end 15bR described above is a swing range 15SR and an outer boundary length 15D of a swing range corresponds to a distance between the left end 15bL and the right end 15bR. A length 21SR in the swing direction (a distance between outer end portions) of the lateral deposition preventing plate 21 is larger than the outer boundary length 15D.

Therefore, since the entire swing range 15SR of the vertical deposition preventing plate 15 can be covered with the lateral deposition preventing plate 21, a state in which end portions of the glass substrate 11 in a direction perpendicular to the swing direction and the vertical deposition preventing plate 15 are covered can be maintained even when the glass substrate 11 is swung during deposition processing.

Further, the length 21SR of the lateral deposition preventing plate 21 in the swing direction is set to be smaller than a length of the target 7 in the swing direction. Thereby, uniform deposition is possible in the entire region in which the lateral deposition preventing plate 21 extends in the swing direction. Accordingly, uniform deposition is possible over the entire surface of the swinging glass substrate 11.

Further, the distance between the lower end 21aL of the upper lateral deposition preventing plate 21EU and the upper end 21aU of the lower lateral deposition preventing plate 21EL, that is, the vertical width WZ of the glass substrate 11 exposed to the front space 41 is set to be smaller than the vertical length 7EZ of the erosion region 7E in the target 7 as shown by a broken line in FIG. 12.

As a result, since the swing region 50 of the glass substrate 11 is set to be smaller than the erosion region 7E of the target 7, deposition uniformity can be obtained.

When the swing shaft 12 is rotated by the rotation drive unit 20, the glass substrate 11 on which the deposition process has been completed rotates around the axis of the swing shaft 12 in a direction opposite to the arrow C shown in FIG. 8 in a state of being held by the holding portion 13 and the vertical deposition preventing plate 15. As shown in FIG. 7, the rotating operation is performed until the glass substrate 11 reaches the horizontal placement position.

Next, the vertical deposition preventing plate 15 rises in a direction opposite to the arrow B shown in FIG. 7 due to the lift pin moving unit and becomes a state shown in FIG. 6. Thereafter, the glass substrate 11 is taken out from a space between the vertical deposition preventing plate 15 and the holding portion 13 in a direction opposite to the arrow A in FIG. 5 by the transfer device 3a (transfer robot). Further, the glass substrate 11 is eventually unloaded from the loading/unloading chamber 2 to the outside via the transfer chamber 3. Further, it is possible to perform other processes in other chambers.

According to the sputtering apparatus 1 according to the present embodiment, deposition uniformity can be improved by causing the substrate holder 10 to be swingable. Further, generation of deposits in the back space 42 during deposition can be reduced and thereby the number of generated particles can be reduced due to the vertical deposition preventing plate 15 swinging in synchronism with the holding portion 13 and the lateral deposition preventing plate 21 attached to the deposition port 4b of the deposition chamber 4.

Comparison Between the Swing Type Target and the Target According to the Above-Described Embodiment As a structure different from the above-described embodiment, for example, a sputtering apparatus including a swing type target in which a target swings is known. In an apparatus in which the swing type target is employed, not only the target but also a wiring connected to the target and a housing (internal chamber) surrounding a magnetic circuit are provided in a deposition chamber. As shown in FIG. 12, the housing exposes a surface of the target to the front space 41. This housing is a swing part, and the housing also swings in the deposition chamber when the target is swung.

In a case of a configuration in which such a swing type target is included, not only deposits accompanying deposition are deposited on a surface of the region shown by hatched lines in FIG. 12, but also deposits are deposited on side surfaces or a back surface of the housing that is not facing the glass substrate. In other words, in a structure including a swing type target, a surface area on which deposits are deposited increases.

On the other hand, according to the sputtering apparatus 1 according to the present embodiment, deposits accompanying deposition are deposited only on the surface of the region shown by the hatched lines in FIG. 12. In other words, unlike the swing type target, since a housing is not provided, deposits are not deposited on side surfaces or a back surface of the housing. That is, a surface area on which deposits are deposited can be reduced.

As an example, in the present embodiment, an area in which deposits adhere to a swing part can be reduced to approximately ⅔ to ½ as compared with that in the case of the swing type target.

In this example, an area to which deposits adhere can be reduced to approximately 1.5 to 2 times an area of a swing part constituting the swing type target.

At the same time, according to the present embodiment, a volume of the deposition chamber 4 can be reduced and space saving can be achieved as compared with the case of the swing type target. Further, since the swing drive unit 20 (rotation drive unit) is disposed outside the deposition chamber (vacuum chamber), the amount of particle generation can be reduced.

While preferred embodiments of the invention have been described and shown above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

DESCRIPTION OF REFERENCE NUMERALS

1 Sputtering apparatus (film formation apparatus)
2, 2A Loading/unloading chamber (vacuum chamber)
3 Transfer chamber (vacuum chamber)
3a Transfer device (transfer robot)
3a Transfer device
3a Transfer robot
4, 4A Deposition chamber (vacuum chamber)
4a Transfer port
4b Deposition port
6 Backing plate (cathode, cathode electrode)
7 Target
7E Erosion region
7L Left end target
7LE, 7LR Erosion
7R Right end target
10 Substrate holder (holding means)
10R Region
11a Processing surface (surface)
11EL, 15aR, 15bL Left end
11ER, 15aL, 15bR Right end
11L, 11U Edge portion
11ML, 11MR, PL, PR Position
11WX Lateral width
11Y Vertical edge portion
11 Glass substrate (substrate to be processed)
12 Swing shaft (swing unit, swing means)
12a Attachment member
13 Holding portion
15, 15EL, 15ER Vertical deposition preventing plate
15a, 21a Opening
15b, 21b Inclined portion
15L, 21aL Lower end
15SR Swing range
15U, 21aU Upper end
20 Swing drive unit (rotation drive unit)
21, 21EL, 21EU Lateral deposition preventing plate
41 Front space
42 Back space
50 Swing region
AX Axial direction
LS Lower edge side
R Rotation direction
R Right edge side

What is claimed is:

1. A sputtering apparatus for performing deposition on a substrate to be processed using a sputtering method, the sputtering apparatus comprising:

a vacuum chamber including a front space, a back space, and a deposition port, the deposition port being provided in the back space, the deposition port opening to the front space, the deposition port having an upper position, a lower position, a right edge side, and a left edge side;

a target provided on a surface of a cathode provided in the front space of the vacuum chamber;

a substrate holder provided in the back space of the vacuum chamber, the substrate holder holding the substrate to be swingable such that the target and a processing surface of the substrate face each other; and a swing unit that causes the substrate holder to be swingable with respect to the target, wherein a region between a right end of the substrate when the substrate reaches a right position and a left end of the substrate when the substrate reaches a left position is set to be smaller than an erosion region of the target, the swing unit includes a swing shaft extending in a swing direction and includes a swing drive unit which swings the substrate holder in an axial direction of the swing shaft, the swing drive unit is connected to the swing shaft and is swingable in the axial direction, the swing drive unit serves as a rotation drive unit that rotates the swing shaft around the axial direction, the rotation drive unit causes the substrate holder to be rotatable between a horizontal placement position and a vertical processing position due to rotation of the swing shaft, the substrate, when in a substantially horizontal position, is placed on the substrate holder or removed from the substrate holder in the horizontal placement position, the processing surface of the substrate is raised upward in a substantially vertical direction to the vertical processing position, the substrate holder includes two vertical deposition preventing plates, and each of the two vertical deposition preventing plates extends in a direction intersecting the swing direction, one of the two vertical deposition preventing plates is disposed at one of two end positions of the substrate in the swing direction of the substrate holder, and the other of the two vertical deposition preventing plates is disposed at the other of the two end positions of the substrate in the swing direction of the substrate holder, the two vertical deposition preventing plates are configured to rotate in synchronism with the substrate holder by a rotating operation of the swing shaft in a state in which the substrate is sandwiched between the substrate holder and the two vertical deposition preventing plates, when the substrate holder is disposed at the vertical processing position, the two vertical deposition preventing plates are positioned to close the deposition port and are configured to swing in synchronism with a swing operation in a lateral direction of the substrate holder, the right edge side of the deposition port is covered with one of the two vertical deposition preventing plates, and the left edge side of the deposition port is covered with the other of the two vertical deposition preventing plates, the vacuum chamber includes two lateral deposition preventing plates configured to be not in synchronism with swinging of the substrate holder, one of the two lateral deposition preventing plates is provided at the upper position of the deposition port, and the other of the two lateral deposition preventing plates is provided at the lower position of the deposition port, a length of each of the two vertical deposition preventing plates is set to be larger than a length between the two lateral deposition preventing plates facing each other in the direction intersecting the swing direction, a length in the swing direction of each of the two lateral deposition preventing plates is set to be larger than a distance between a right outer edge of one of the two vertical deposition preventing plates and a left outer edge of the other of the two vertical deposition preventing plates in the swing direction, the swing drive unit is disposed outside the vacuum chamber, when the substrate holder is disposed at the vertical processing position, the two vertical deposition preventing plates and the two lateral deposition preventing plates are combined into a frame shape, and in a central portion surrounded by the two vertical deposition preventing plates and the two lateral deposition preventing plates, an opening penetrating in a thickness direction of each of the two vertical deposition preventing plates is formed, the substrate exposed to the opening is in a state of facing the target, and a deposition process is performed in the vacuum chamber.

2. The sputtering apparatus according to claim 1, wherein a length of each of the two lateral deposition preventing plates in the swing direction is set to be smaller than a length of the target in the swing direction.

3. The sputtering apparatus according to claim 1, further comprising:

a magnetron magnetic circuit disposed on a back surface of the cathode and configured to generate magnetron plasma; and a magnetic circuit swing unit which swings the magnetron magnetic circuit with respect to the back surface of the cathode and causes plasma, when the magnetron plasma is generated in accordance therewith, to move on a surface of the target.

* * * * *